United States Patent
Pinna et al.

(10) Patent No.: US 11,018,690 B2
(45) Date of Patent: May 25, 2021

(54) DEVICE FOR GENERATING A RANDOM ELECTRICAL SIGNAL AND ASSOCIATED ARCHITECTURE

(71) Applicants: THALES, Courbevoie (FR); Centre National de la Recherche Scientifique, Paris (FR)

(72) Inventors: Daniele Pinna, Paris (FR); Julie Grollier, Paris (FR); Vincent Cros, Paris (FR); Damien Querlioz, Sceaux (FR); Pierre Bessiere, Paris (FR); Jacques Droulez, Paris (FR)

(73) Assignee: THALES, Paris (FR)

( * ) Notice: Subject to any disclaimer, the term of this patent is extended or adjusted under 35 U.S.C. 154(b) by 296 days.

(21) Appl. No.: 16/302,619

(22) PCT Filed: May 18, 2017

(86) PCT No.: PCT/EP2017/061941
§ 371 (c)(1),
(2) Date: Nov. 16, 2018

(87) PCT Pub. No.: WO2017/198758
PCT Pub. Date: Nov. 23, 2017

(65) Prior Publication Data
US 2019/0296765 A1  Sep. 26, 2019

(30) Foreign Application Priority Data
May 18, 2016 (FR) ...................................... 16 00791

(51) Int. Cl.
*H03M 7/26* (2006.01)
*G06F 7/58* (2006.01)
*G06F 7/70* (2006.01)

(52) U.S. Cl.
CPC .............. *H03M 7/26* (2013.01); *G06F 7/588* (2013.01); *G06F 7/70* (2013.01)

(58) Field of Classification Search
CPC .. G06F 7/58; G06F 7/588; G06F 7/70; G06N 7/043; G06N 7/005; H03M 7/26; H01L 43/00–14
See application file for complete search history.

(56) References Cited

U.S. PATENT DOCUMENTS

| 2013/0166307 A1 | 6/2013 | Vernon |
| 2014/0185811 A1 | 7/2014 | Stein et al. |

(Continued)

FOREIGN PATENT DOCUMENTS

| WO | 2009045649 A1 | 4/2009 |
| WO | 2015015007 A1 | 2/2015 |

OTHER PUBLICATIONS

A. Fert et al., Skyrmions on the track, Nature Nanotechnology, vol. 8, 2013 (Year: 2013).*

(Continued)

*Primary Examiner* — Aimee Li
*Assistant Examiner* — Emily E Larocque
(74) *Attorney, Agent, or Firm* — Soquel Group LLC

(57) ABSTRACT

A device for generating a random electric signal, including an input duct, an output duct, a generator of magnetic particles generating magnetic particles in the input duct, a diffusion chamber connected to the input duct and the output duct, wherein the diffusion chamber is designed to diffuse the generated magnetic particles, a displacement unit for displacement of the generated magnetic particles towards the diffusion chamber, and a converter that is designed to generate an electrical signal proportional to a characteristic, wherein the characteristic is the particle density in the diffusion chamber or the passage of magnetic particles at a (Continued)

predetermined location of an output duct connected to the diffusion chamber.

10 Claims, 2 Drawing Sheets

(56) References Cited

U.S. PATENT DOCUMENTS

2015/0199177 A1* 7/2015 Braganca .............. G11B 5/746
                                                      365/158
2017/0206921 A1* 7/2017 Nagaosa .............. G11C 19/085

OTHER PUBLICATIONS

J. Sampaio et al., Nucleatio, stability and current-induced motion of isolated magnetic skyrmions in nanostructures, Nature Nanotechnology, vol. 8, 2013 (Year: 2013).*

D. Pinna et al, Skyrmian Gas Manipulation for Probabalistic Computing, Americal Physical Society, 2018 (Year: 2018).*

Anonymous: "Artificial Magnetic Monopoles Discovered," XP055336087, May 31, 2013, 7 pages.

Kirakosyan, A. S. et. al., "From Bubble to Skyrmion: Dynamic Transformation Mediated by a Strong Magnetic Tip," Arxiv.org, Cornell University Library, 201 Olin Library Cornell University, Ithaca, NY 14853, May 21, 2003, XP080116951, 10 pages.

Iwasaki, J. et. al., "Current-Induced Skyrmion Dynamics in Constricted Geometries," Nature Nanotechnology, vol. 8., No. 10, Sep. 8, 2013, XP055119148, pp. 742-747.

Chui C. P. et. al., "Skyrmion Stability in Nanocontact Spin-Transfer Oscillators," AIP Advances, American Institute of Physics, 2 Huntington Quadrangle, Melville, NY 11747, vol. 5, No. 9, Jan. 1, 1901, XP012200245, 13 pages.

Finocchio, G. et. al., "Skyrmion Based Microwave Detectors and Harvesting," Applied Physics Letters, AIP Publishing LLC, US, vol. 107, No. 26, Dec. 28, 2015, XP012204087, 5 pages.

Crum, Dax M. et. al., "Perpendicular Reading 1-10 of Single Confined Magnetic Skyrmions," Nature Communications, vol. 6, Jul. 1, 2015, XP055336074, 19 pages.

International Search Report for Patent Application No. PCT/EP2017/061941, dated Jul. 20, 2017, 3 pages.

INPI Rapport de Recherche Préliminaire for French Patent Application No. 1600791, dated Jan. 18, 2017, 3 pages.

* cited by examiner

DEVICE FOR GENERATING A RANDOM ELECTRICAL SIGNAL AND ASSOCIATED ARCHITECTURE

CROSS-REFERENCE TO RELATED APPLICATIONS

This application claims benefit under 35 USC § 371 of PCT Application No. PCT/EP2017/061941 entitled DEVICE FOR GENERATING A RANDOM SIGNAL AND ASSOCIATED ARCHITECTURE, filed on May 18, 2017 by inventors Daniele Pinna, Julie Grollier, Vincent Cros, Damien Querlioz, Pierre Bessiere and Jacques Droulez. PCT Application No. PCT/EP2017/061941 claims priority of French Patent Application No. 16 00791, filed on May 18, 2016.

FIELD OF THE INVENTION

The present invention relates to a device for generating a random electrical signal. The present invention also relates to an architecture comprising such a device.

BACKGROUND OF THE INVENTION

The invention lies in the field of stochastic computing.

Stochastic computing is an approach that simultaneously addresses a significant problem in semiconductor systems and many nano-electronic systems. In fact, as the size of the entities in the computer chips is reduced, ideal behavior cannot always be guaranteed. In such systems, the results of individual operations are described only statistically or probabilistically.

Stochastic computing seeks to deal with probabilistic computing elements rather than designing ways to make them ideal or deterministic. Recent research suggests that natural biological systems are probabilistic in nature.

More specifically, stochastic computing encompasses a set of techniques that represent the values by random bit streams. The value encoded in the bit stream corresponds to the fraction of bits observed in the state "1".

Stochastic computing makes it possible to perform more complex calculations on these values than operations performed bit by bit. For example, multiplication on two-bit streams may be performed by simply using an "AND" gate. Since the two input streams are handled by the gate, the output stream provides a very fast approximate estimate of the result. This estimate becomes more accurate as the input streams are extensive. In addition, the operations proposed in the context of stochastic computing are robust against noise. In fact, the accidental switching of a few bits in the stream does not have an impact on the final result of the multiplication.

Thus, it is desirable to have tools for implementing stochastic computing.

Since all calculations are performed by gates operating on the random bit streams, the statistical decorrelation of the bit streams used is essential to ensure a low error rate.

However, the cascading of gates to perform complex operations tends to favor the correlation of the signals, which makes crucial the technical implementation of stochastic "reshuffler", i.e. of a device capable of converting a random input signal into a random and decorrelated output signal.

However, the systems enabling such a conversion are systems based on decorrelation filters as described in applications WO 2009/045649, US 2013/0166307 and US 2014/0185811. These are therefore bulky systems with dimensions usually greater than 4000 pmt.

There is therefore a need for a device capable of converting a random input signal into a random and decorrelated output signal having a smaller size than in systems using decorrelation filters.

SUMMARY OF THE DESCRIPTION

For this purpose, a device for generating a random electrical signal is described, wherein the device comprises at least one input duct, at least one output duct, a magnetic particle generator capable of generating magnetic particles in the input duct, a diffusion chamber connected to at least one input duct and at least one output duct, wherein the diffusion chamber is able to diffuse the generated magnetic particles, a unit for displacing the generated magnetic particles towards the diffusion chamber, and a converter that is designed to generate an electrical signal proportional to a characteristic relating to the magnetic particles, wherein the characteristic is the density of magnetic particles in the diffusion chamber or the passage of magnetic particles at a predetermined location of an output duct connected to the diffusion chamber.

According to particular embodiments, the device comprises one or more of the following characteristics, taken individually or according to all the technically feasible combinations:

the magnetic particle generator is capable of generating skyrmions;

a control unit comprising an input terminal for a random input signal, wherein the control unit is able to control the magnetic particle generator as a function of the random input signal;

the control unit is able to control the magnetic particle generator to generate a magnetic particle in the presence of a predetermined transition between two predefined states.

a thermostat able to control the temperature of the diffusion chamber;

at least either the geometry or the arrangement of the ducts connected to the diffusion chamber is chosen to maximize the probability that the magnetic particles will be diffused;

the diffusion chamber comprises a shutter capable of closing off each output duct.

An architecture is also proposed to generate a random electrical signal comprising a plurality of devices as described above, wherein a control unit comprises an input terminal for a random input signal, wherein the control unit is able to control each magnetic particle generator according to the random input signal.

According to particular embodiments, the architecture comprises one or more of the following characteristics, taken individually or according to all the technically feasible combinations:

the random input signal is broken down into a number of predefined states and into transitions between these states, wherein the control unit is able to control each magnetic particle generator according to the states and transitions;

the architecture comprises two devices, a first device and a second device, wherein the random input signal breaks down into transitions between two states called low state and high state, wherein a high transition is a transition from the low state to the high state, and a low transition is a transition from the high state to the low state, wherein the control unit is designed to control the first magnetic particle generator to generate a magnetic particle in the presence of a high transition, while the control unit is designed to control the second magnetic particle generator to generate a magnetic particle in the presence of a low transition.

BRIEF DESCRIPTION OF THE DRAWINGS

Other features and advantages of the invention will appear upon reading the description which follows, given solely by way of example and with reference to the appended drawings, wherein.

DETAILED DESCRIPTION

Figure 1:
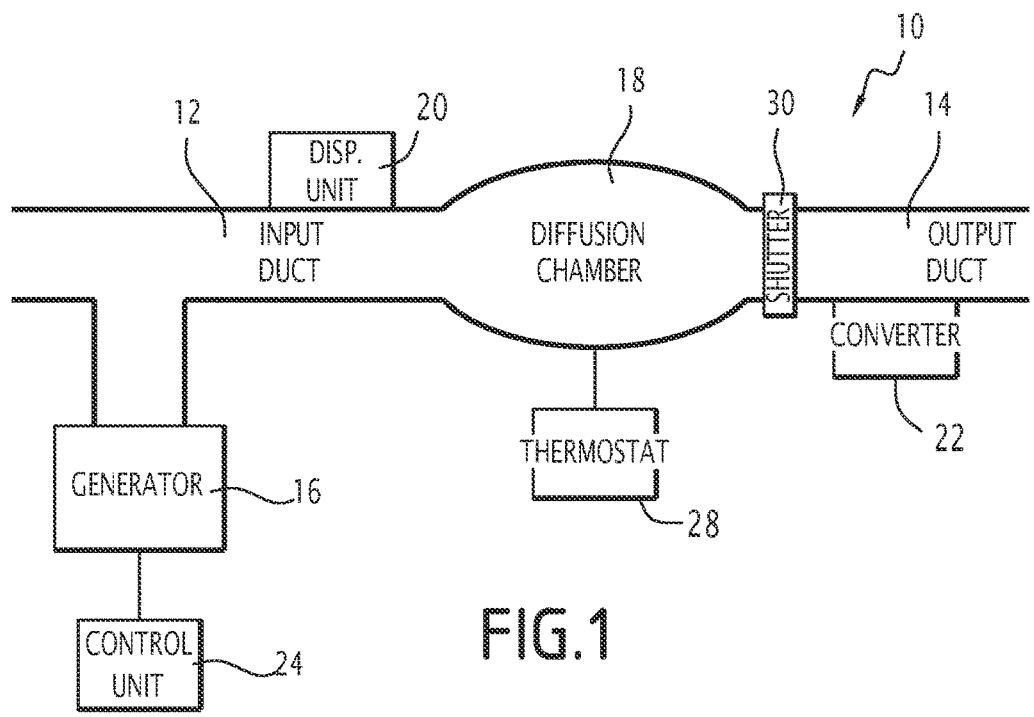
FIG. 1 shows a schematic view of an example of a device for generating a random electrical signal.

FIG. 1 shows a device 10.

The device 10 is a device for generating a random electrical signal.

Preferably, the device 10 is a device capable of generating a random electrical signal by conversion of a random input signal, wherein the output signal is decorrelated from the input signal.

The device 10 comprises an input duct 12, an output duct 14, a generator 16, a diffusion chamber 18, a displacement unit 20, a converter 22, a control unit 24 and a thermostat 28.

The input duct 12 is in the form of a duct.

The input duct 12 opens into the diffusion chamber 18.

The output duct 14 is in the form of a duct.

The diffusion chamber 18 opens into the output duct 14.

According to the example of FIG. 1, the input duct 12 and the output duct 14 are diametrically opposed.

The generator 16 is a generator of magnetic particles.

The generator 16 is able to generate magnetic particles in the input duct 12.

According to the illustrated example, the generator 16 is able to generate skyrmions.

The generator 16 is, for example, a magnetic tunnel junction.

The diffusion chamber 18 is able to diffuse the generated magnetic particles.

In the illustrated example, the diffusion chamber 18 has a spherical shape.

The diffusion chamber 18 connects the input duct 12 to the output duct 14.

The diffusion chamber 18 comprises a shutter 30 that is designed to close the output duct 14.

The displacement unit 20 is able to move generated magnetic particles towards the diffusion chamber 18.

For simplicity, the displacement unit 20 is shown in FIG. 1 as an independent block. However, usually, the displacement unit 20 is, in practice, a magnetic layer on which an electric current flows, so that from above, the displacement unit 20 is located below the diffusion chamber 18, the input duct 12 and the output duct 14.

The converter 22 is designed to generate an electrical signal that is proportional to a characteristic relating to the magnetic particles.

In a particular example, the converter 22 is a magnetic tunnel junction.

According to the embodiment of FIG. 1, the characteristic is the passage of magnetic particles at a predetermined location of the output duct 14.

The control unit 24 comprises an input terminal for a random input signal.

The control unit 24 is able to control the generator 16 as a function of the random input signal.

According to the illustrated example, the control unit 24 is able to control the generator 16 to generate a magnetic particle in the presence of a predetermined transition between two predefined states.

The thermostat 28 is able to control the temperature of the diffusion chamber 18.

The operation of the device 10 is now described.

The control unit 24 receives a random input signal.

The random input signal comprises a transition from a low state to a high state at a first instant t1.

The control unit 24 converts the random input signal by instructing the generator 16 to generate skyrmions at the first instant t1.

The skyrmions are generated in the input duct 12.

The displacement unit 20 moves the generated skyrmions towards the diffusion chamber 18.

The skyrmions undergo diffusion in the diffusion chamber 18.

In such an embodiment, it is assumed that the shutter 30 does not obstruct the output duct 14.

In this case, the converter 22 generates an electrical signal proportional to the detection of a passage of skyrmions at a predetermined location of the output duct 14.

At each passage of skyrmions, it is considered that the electrical signal of the converter comprises a transition between a low state and a high state at the second instant t2.

By this simple implementation example, it appears that a random electric input signal may be converted into another random output signal. This conversion takes place in both illustrated cases.

In addition, since skyrmions are used, the device 10 is of reduced size. In fact, the size of the diffusion chamber 18 is less than one square micrometer.

In addition, the energy ensuring the operation of the device 10 is very low. Typically, for a current of a few microamperes, the application of a voltage of a few hundred millivolts is sufficient. The device 10 is therefore energy efficient.

More generally, the device 10 converts a random input signal into another uncorrelated random signal output.

Such a conversion takes place exactly if the number of magnetic particles is conserved during the diffusion operation. When the number of magnetic particles is not conserved, the conversion is only approximate.

In other words, the device 10 uses the diffusion of the particles due to the thermal noise to decorrelate the random input signal, which, in the ideal case and implies a conservation of the particles and a sufficient diffusion time. The diffusion time depends on several factors such as the intensity of the current, the size of the skyrmions and the size of the diffusion chamber 18. The usual diffusion time is between 1 microsecond and 1 millisecond.

Figure 2:
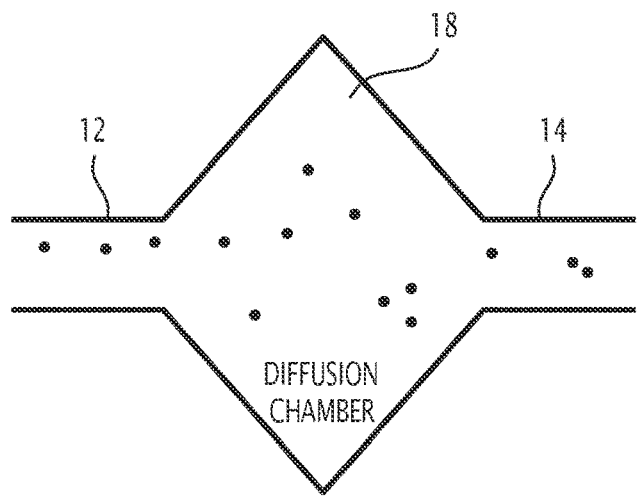
FIG. 2 shows a schematic view of a portion of another example of a device for generating a random electrical signal.

As a result, other embodiments of the device 10 are conceivable. Some of these embodiments are described in FIGS. 2, 3 and 4.

According to another embodiment, the converter 22 is placed in the diffusion chamber 18.

In this case, the characteristic is the density of magnetic particles in the diffusion chamber 18 and not the passage of magnetic particles at a predetermined location of the output duct 14.

The operation of the device 10 in this embodiment differs somewhat from the previously presented operation.

In fact, in this case, it is assumed that the shutter 30 closes the output duct 14.

In this case, the converter 22 generates an electrical signal that is proportional to the density of skyrmions in the diffusion chamber 18.

It should be noted that, in this first case, the device 10 also serves as a storage device.

In another example, the shape of the diffusion chamber 18 is different.

The diffusion chamber 18 has, for example, a shape of polygonal section. According to the example of FIG. 2, the diffusion chamber 18 has a shape of square section.

Figure 3:
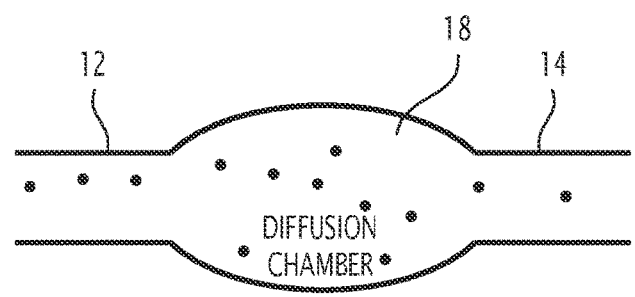
FIG. 3 shows a schematic view of a portion of yet another example of a device for generating a random electrical signal.

According to another example, illustrated in particular in FIG. 3, the diffusion chamber 18 has an ellipsoidal shape.

Figure 4:
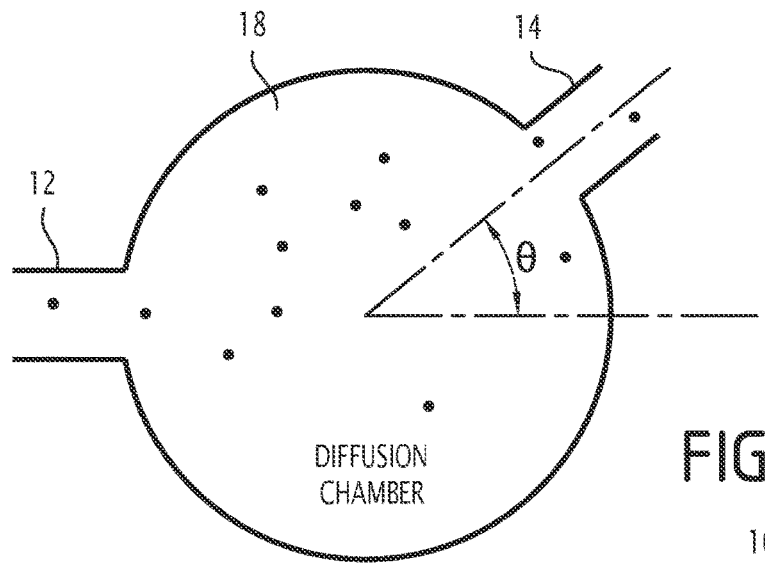
FIG. 4 shows a schematic view of a portion of yet another example of a device for generating a random electrical signal.

According to yet another example, the input duct 12 and the output duct 14 are not diametrically opposed but form an angle designated θ in FIG. 4.

In general, at least either the geometry or the arrangement of the ducts connected to the chamber is chosen to maximize the probability that the magnetic particles will be diffused in the diffusion chamber 18.

It should also be noted that the ideal geometry depends on multiple factors including particle size.

Alternatively, the device 10 may comprise a plurality of ducts, wherein each is connected to the diffusion chamber 18.

Since the ducts actually followed by the magnetic particle are a priori random, the output signal is decorrelated from the random input signal even better.

Moreover, by interpreting the random electric signal as a random number generation, it is possible to extend the proposed principle with the device 10 of FIG. 1 and aim at multi-level operation making it possible to generate any random number.

Figure 5:
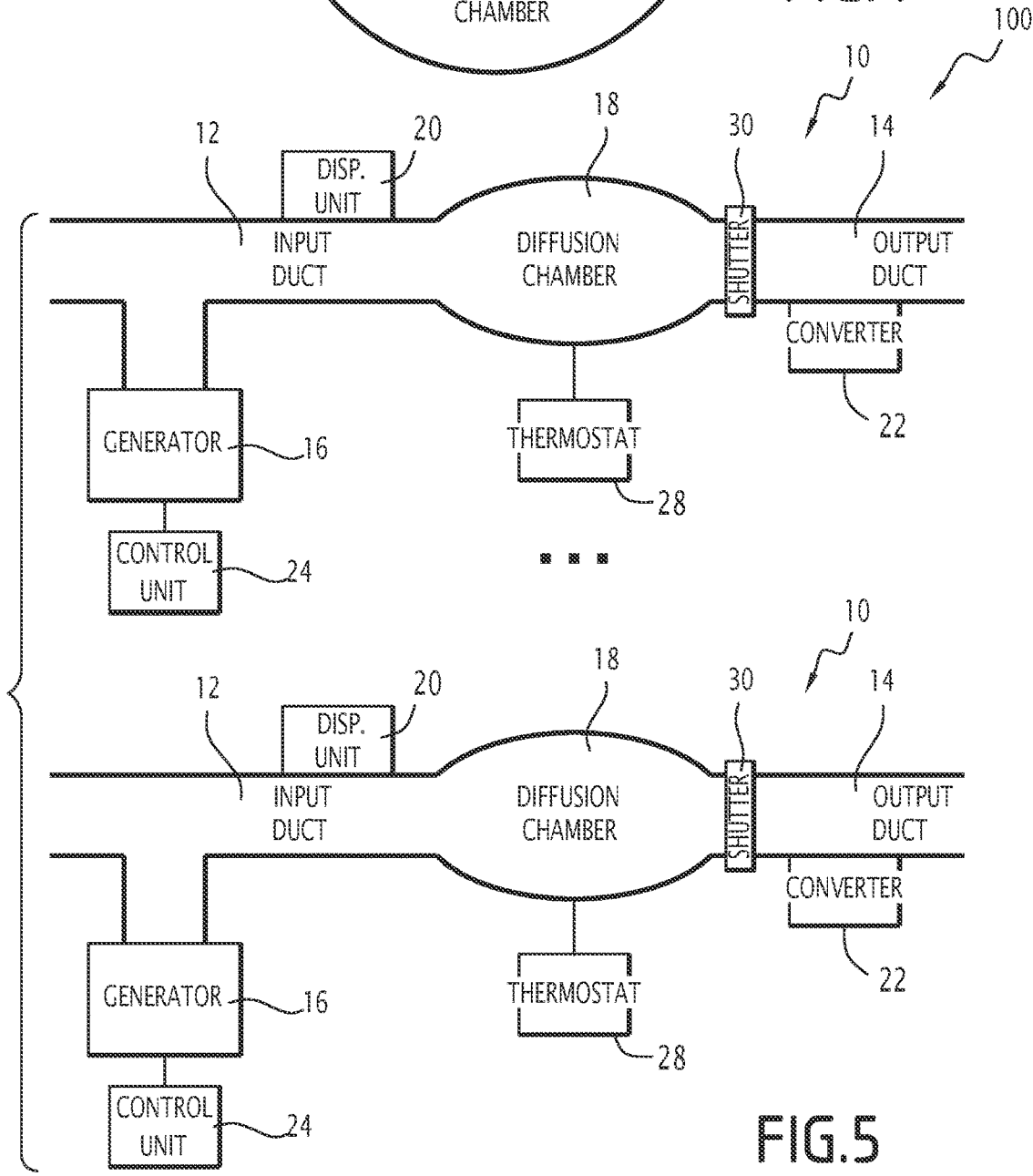
FIG. 5 shows a schematic view of an example of the architecture.

For this, with reference to FIG. 5, an architecture 100 comprising a plurality of devices 10 is proposed. Only two devices 10 are shown in FIG. 5.

In this case, the random input signal is broken down into a number of predefined states and transitions between these states and the control unit 24, which is divided into several sub-units (one sub-unit per device 10), is designed to control each generator 16 of magnetic particles according to the states and transitions.

The operation of the architecture 100 is now described with reference to the case where the architecture 100 comprises two devices 10, wherein the extension to a greater number of devices 10 is immediate.

In such a case, the random input signal is broken down into transitions between two states called low state and high state.

A high transition is a transition from the low state to the high state, while a low transition is a transition from the high state to the low state.

The control unit 24 controls the first magnetic particle generator 16 to generate a magnetic particle in the presence of a high transition. Respectively, the control unit 24 controls the second generator 16 of magnetic particles to generate a magnetic particle in the presence of a low transition.

By recombining the signals obtained at the output of each of the devices 10, a random output signal is obtained which is decorrelated from the random input signal and is a two-level signal.

The advantages of the device 10 therefore apply for the architecture 100.

The same principle would apply for any number of levels.

The invention claimed is:

1. A device for generating a random electrical signal, comprising:
   at least one input duct;
   at least one output duct;
   a generator of magnetic particles capable of generating magnetic particles in the input duct;
   a diffusion chamber connected to at least one of said input ducts and to at least one duct of said output ducts, wherein the diffusion chamber is able to diffuse the generated magnetic particles;
   a unit for displacement of the generated magnetic particles towards the diffusion chamber; and
   a converter that is designed to generate an electric signal proportional to a characteristic relating to the generated magnetic particles, wherein the characteristic is the density of magnetic particles in said diffusion chamber, or the passage of magnetic particles at a predetermined location of one of said output ducts that is connected to said diffusion chamber.

2. The device according to claim 1, wherein said generator of magnetic particles is designed to generate skyrmions.

3. The device according to claim 1, further comprising a control unit comprising an input terminal of a random input signal, wherein the control unit is designed to control said generator of magnetic particles according to the random input signal.

4. The device according to claim 3, wherein said control unit is designed to control said generator of magnetic particles to generate a magnetic particle in the presence of a predetermined transition between two predefined states.

5. The device according to claim 1, further comprising a thermostat that is designed to control the temperature of said diffusion chamber.

6. The device according to claim 1, wherein at least either the geometry or the arrangement of said input and output ducts that are connected to said diffusion chamber is chosen to maximize the probability that the generated magnetic particles will be diffused.

7. The device according to claim 1, wherein said diffusion chamber comprises a shutter that is designed to close each output duct.

8. An architecture for generating a random electrical signal comprising:
   a plurality of devices according to claim 1,
   a control unit comprising an input terminal for the introduction of a random input signal, wherein the control unit is able to control each generator of magnetic particles according to the random input signal.

9. The architecture according to claim 8, wherein the random input signal is broken down into a number of predefined states and transitions between these states, and wherein said control unit is able to control each generator of magnetic particles according to the states and transitions.

10. The architecture according to claim 8, comprising two devices, a first device and a second device, wherein the random input signal breaks down into transitions between two states called low state and high state, wherein a high transition is a transition from the low state to the high state, and a low transition is a transition from the high state to the low state, wherein said control unit is designed to control the first generator of magnetic particles to generate a magnetic particle in the presence of a high transition, and to control the second generator of magnetic particles to generate a magnetic particle in the presence of a low transition.

* * * * *

UNITED STATES PATENT AND TRADEMARK OFFICE
CERTIFICATE OF CORRECTION

PATENT NO. : 11,018,690 B2
APPLICATION NO. : 16/302619
DATED : May 25, 2021
INVENTOR(S) : Pinna et al.

Page 1 of 1

It is certified that error appears in the above-identified patent and that said Letters Patent is hereby corrected as shown below:

On the Title Page

Item (73) Assignees should read:
THALES, Courbevoie (FR); Centre National
de la Recherche Scientifique, Paris (FR)

Signed and Sealed this
Seventh Day of February, 2023

Katherine Kelly Vidal
*Director of the United States Patent and Trademark Office*